United States Patent [19]
Barnett et al.

[11] Patent Number: 4,876,210
[45] Date of Patent: Oct. 24, 1989

[54] SOLUTION GROWTH OF LATTICE MISMATCHED AND SOLUBILITY MISMATCHED HETEROSTRUCTURES

[75] Inventors: Allen M. Barnett, Newark, Del.; John C. Zolper, Glen Rock, N.J.

[73] Assignee: The University of Delaware, Newark, Del.

[21] Appl. No.: 163,897

[22] Filed: Mar. 4, 1988

Related U.S. Application Data

[63] Continuation of Ser. No. 44,151, Apr. 30, 1987, abandoned.

[51] Int. Cl.$^4$ .................... H01L 31/18; H01L 21/208
[52] U.S. Cl. ......................................... 437/5; 136/262; 148/DIG. 59; 148/DIG. 66; 437/92; 437/130; 437/132; 437/972
[58] Field of Search .................. 437/5, 81, 90-92, 437/128, 130-132, 965, 972; 148/DIG. 59, DIG. 66; 136/262

[56] References Cited

U.S. PATENT DOCUMENTS

| | | | |
|---|---|---|---|
| 3,630,693 | 12/1971 | Moody et al. | 437/3 |
| 3,963,539 | 6/1976 | Kemlage et al. | 437/127 |
| 4,370,510 | 1/1983 | Stirn | 136/262 |
| 4,392,297 | 7/1983 | Little | 437/5 |
| 4,522,661 | 6/1985 | Morrison et al. | 148/33.2 |
| 4,727,047 | 2/1988 | Bozler et al. | 437/89 |

OTHER PUBLICATIONS

H. J. Hovel, "Solar Cells", vol. II in *Semiconductors and Semimetals*, Academic Press, New York (1975), pp. 192
F. Therez et al., *Solar Cells*, vol. 18, pp. 163-170 (1986).

*Primary Examiner*—Aaron Weisstuch
*Attorney, Agent, or Firm*—Connolly & Hutz

[57] ABSTRACT

The effects of excessive lattice mismatch in solution grown heterostructures are reduced by incorporating a lattice graded interface layer between the substrate and the heteroepitaxial layer. The effects of lattice mismatch are also reduced by reducing the contact area with a selective growth mask which controls where growth initiates on the substrate. The effect of mismatched solubility is reduced by double saturation of the solvent and selective supersaturation of the solvent.

14 Claims, 2 Drawing Sheets

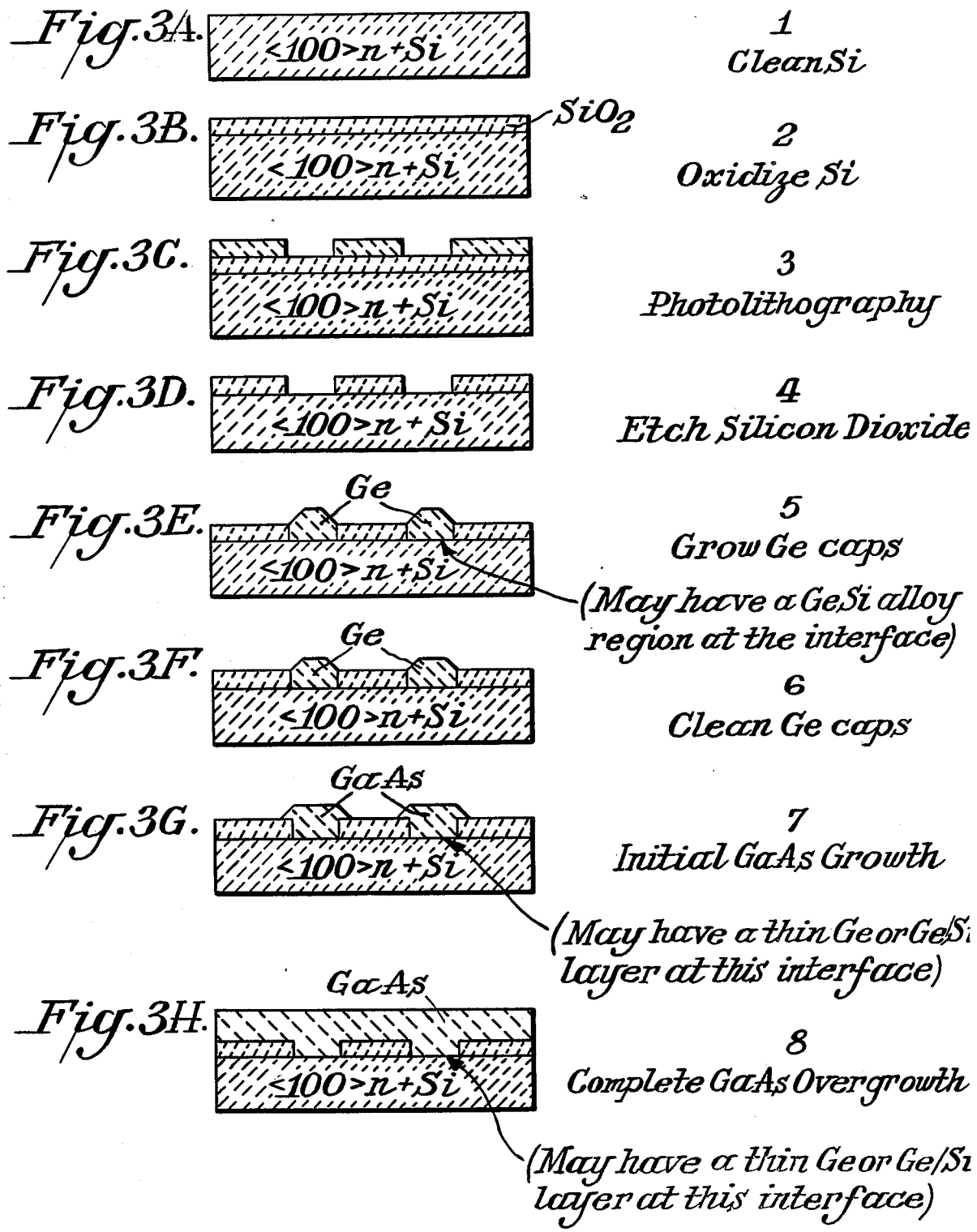

SOLUTION GROWTH OF LATTICE MISMATCHED AND SOLUBILITY MISMATCHED HETEROSTRUCTURES

CROSS-REFERENCE TO RELATED APPLICATION

This application is a continuation in part of application Ser. No. 44,151, filed Apr. 30, 1987, now abandoned.

BACKGROUND OF THE INVENTION

The deposition of GaAs by solution growth (SG), similar to liquid phase epitaxy (LPE), has several advantages for fabricating large area electronic quality GaAs layers on Si substrates. The first of these advantages and the most critical is the resulting high material quality. GaAs material grown from solution on GaAs substrates has, in general, demonstrated devices that are "superior in performance to those grown by other methods", as reported by R. L. Moon, Crystal Growth, 2nd ed., B. R. Pamplin, ed., Pergamon Press, p. 421 (1980). For GaAs solar cells, this superior device performance is seen in high short circuit currents. Using LPE, Hovel and Woodall (H. J. Hovel and J. M. Woodall, 12th IEEE PVSC, 945 (1976)) have achieved the highest short circuit currents for GaAs solar cells. The high currents are a result of long minority carrier diffusion lengths in the SG GaAs.

GaAs growth on Si has been widely studied but solution growth has gone largely uninvestigated. The only known report of the solution growth of GaAs on Si is V. A. Presnov, et al., Sov. Phys. Crystallogr., 23(1), 121, (1978). Until now, solution growth has gone largely uninvestigated for fabricating large area heterostructures such as GaAs on Si. Previous attempts to grow GaAs on Si by liquid phase epitaxy have not been successful. The failures have been attributed to dissolution of the substrate due to solubility mismatch between the substrate and the growth solvent and to lattice mismatch between the substrate and heteroepitaxial layer. Applicants have further discovered that mismatches in thermal expansion, as well as the need to prepare the substrate surface prior to solution growth of the heteroepitaxial layer are also obstacles to successful utilization of solution growth processes for heteroepitaxy.

The work of other investigators for large area GaAs on Si structures has focused on vapor phase growth - chemical vapor deposition (CVD) and metallorganic chemical vapor deposition (MOCVD). GaAs has also been successfully deposited on Si by molecular beam epitaxy (MBE) (for example, Newmann et al., J. Appl. Phys., 61(3), 1023 (1987)) but this process is not well suited to large area deposition or high throughput production. The vapor phase techniques have been successfully used to deposit GaAs directly on Si (M. Shimizu, T. Mizuki, M. Miyago, T. Hisamatsu, M. Enatsu, T. Yamaguchi, K. Sugawara, T. Sakurai, K. Awane, 18th IEEE PVSC, Las Vegas, Nev., 1727 (1985)), on Ge substrates, and on Ge layers on Si (Ge/Si) substrates (M. Kato, K. Mitsui. K. Mizuguchi, N. Hayafuji, S. Ochi, Y. Yukimoto, T. Murotani and K. Fujikawa, 18th IEEE PVSC, Las Vegas, 14 (1985), and B-Y Tsaur, John C.C. Fan, G.W. Turner, B.D. King, R.W. McClelland, and G. M. Metze, 17th IEEE PVSC, Orlando, Fla., 440 (1984)). However, the performance of solar cells made from this material has been limited by high crystal defect densities. Table 1 summarizes the solar cell performance degradation caused by depositing GaAs on Ge substrates and Ge layers on Si (Ge/Si) substrates. For comparison, the performance of several GaAs on GaAs solar cells is also included in Table 1. A solar cell from each material system is included from Kato et al. to compare devices from the same deposition system.

TABLE 1

| Investigator & Growth Technique | Area (cm$^2$) | $V_{oc}$ (volts) | $J_{sc}$ (mA/cm$^2$) | FF | n = efficiency |
|---|---|---|---|---|---|
| (a) GaAs on GaAs | | | | | |
| M. Kato MOCVD | 1.0 | 1.01 | 31.5 | 0.84 | 19.7 (AMO) |
| J. G. Werthen[1] MOCVD | 4.0 | 1.05 | 32.3 | 0.84 | 21.5 (AMO) |
| H. J. Hovel LPE | 0.1 | 1.015 | 33.1 | 0.745 | 18.5 (AMO) |
| (b) GaAs on Ge | | | | | |
| M. Kato MOCVD | 1.0 | 1.18 | 29.6 | 0.72 | 18.6 (AMO) |
| (c) GaAs on Ge/Si | | | | | |
| M. Kato MOCVD | 0.25 | 0.66 | 18.4 | 0.61 | 5.5 (AMO) |
| B-Y, Tsaur | 0.093 | 0.8 | 23.0 | 0.75 | 14 (AM1) |
| CVD | 0.51 | 0.79 | 23.0 | 0.61 | 11 (AM1) |

[1] J. G. Werthen, G. F. Virshup, C. W. Ford, C. R. Lewis and H. C. Hamaker, 18th IEEE PVSC, Las Vegas, Nev., 300 (1985).

In Table 1 all three parameters—open circuit voltage, short circuit current, and fill factor—are degraded in the GaAs solar cells on Ge and Ge/Si. (The one exception is the open circuit voltage in the GaAs on Ge solar cell. According to Kato et al., this increase is a result of the photovoltaic effect at the Ge/GaAs heterojunction.) This decreased performance results from the increased defect density in the GaAs. These defects result from strain created by the 4% lattice mismatch between GaAs and Si. These defects reduce the minority carrier diffusion length in the GaAs and cause a corresponding decrease in the short circuit current. Tsaur et al. were successful in reducing the current loss by using growth interrupts to cause the defects to bend over and self-terminate. The short circuit current they report (shown in Table 1), without an AlGaAs window layer, shows that current losses can be minimized. The solar cells of the others contain an AlGaAs window.

The reduction in open circuit voltage is caused by the presence of defects at the GaAs n/p junction and in the bulk that increase the reverse leakage current ($J_0$). To improve the open circuit voltage the defect density must be reduced.

The reduction in fill factor is largely a result of series resistance at the Ge/GaAs interface and shunt effects in the bulk. This series resistance can be reduced by using high doping levels on both sides of the Ge/GaAs interface. This highly doped Ge/GaAs junction should have low series resistance. A second GaAs layer of lower doping is necessary for the absorber/generator of the GaAs solar cell. The high quality of solution grow GaAs should also reduce shunt effects.

SUMMARY OF INVENTION

An object of this invention is to improve the heteroepitaxial solution growth process by overcoming the aforementioned four problems: (1) the effect of substrate/grown-layer lattice mismatch greater than 1%; (2) the effect of unfavorable solubility biases leading to dissolution of the substrate; (3) mismatch in thermal expansion coefficient between substrate and heteroepitaxial layer; and (4) preparation of the substrate surface for heteroepitaxial growth.

In accordance with this invention the effects of excessive lattice mismatch in solution grown heterostructures is reduced by incorporating a lattice graded interface between the substrate and the heteroepitaxial layer. The interface layer may be a compositionally graded Si/Ge layer between a Si substrate and a GaAs heteroepitaxial layer, or a GaAs/GaP graded interface where GaP is lattice matched with Si and the GaP/GaAs has a continuous solid solubility.

Lattice and thermal expansion coefficient mismatch effects may also be reduced by reducing the contact area between the substrate and grown layer with a selective growth mask which controls where growth initiates on the substrate.

The problem of unfavorable solubility biases is overcome by selective supersaturation which involves double saturation of the solvent with both substrate material and growth material and selective supersaturation of the solvent with the growth material.

The problem of preparing the substrate surface for heteroepitaxial growth is overcome by providing a cap layer, such as Ge. The cap layer in accordance with this invention cleans the substrate surface and may also realign the substrate surface for heteroepitaxial growth.

THE DRAWINGS

FIG. 1 is a graph plotting lattice constant versus material composition;

FIG. 2 schematically illustrates a photovoltaic solar cell in accordance with this invention; and FIGS. 3A-3H are a process flow chart illustrating the growth of GaAs on Si in accordance with this invention.

DETAILED DESCRIPTION

The present invention is directed to improving the solution growth process by overcoming the following problems: (1) the effect of substrate/grown-layer lattice mismatch, and in particular when the mismatch is greater than 1%; (2) the effect of unfavorable solubility biases that exist when the material to be grown or deposited has a lower solubility in the solvent than the substrate material; (3) mismatch in thermal expansion coefficient between substrate and heteroepitaxial layer; and (4) preparation of the substrate surface for heteroepitaxial growth.

Generally, the first problem, a substrate/grown-layer lattice mismatch greater than 1% is considered sufficient to hinder or prohibit crystal growth. This invention permits the growth of layers with lattice mismatch with the substrate of greater than 1% with the substrate by reducing the detrimental effects of the lattice mismatch.

Two features of this invention reduce the effects of excessive lattice mismatch: (1) the incorporation of an appropriate lattice grading interface layer and (2) the reduction of substrate/grown-layer contact by appropriate growth masks and selective heteroepitaxial growth. An example of the first feature uses a compositionally graded Si/Ge (Si and Ge have a continuous solid solubility) interface layer between a Si substrate and a GaAs heteroepitaxial layer. Since Ge is lattice matched to GaAs, this system allows GaAs, which has a 4% larger lattice constant than Si, to be grown on Si. A second example of growing GaAs on Si uses a GaAs/GaP graded interface where GaP is lattice matched with Si and the GaP/GaAs system has a continuous solid solubility. By selecting the proper material system lattice grading can be accomplished over a wide range of lattice constants.

Figure 1:
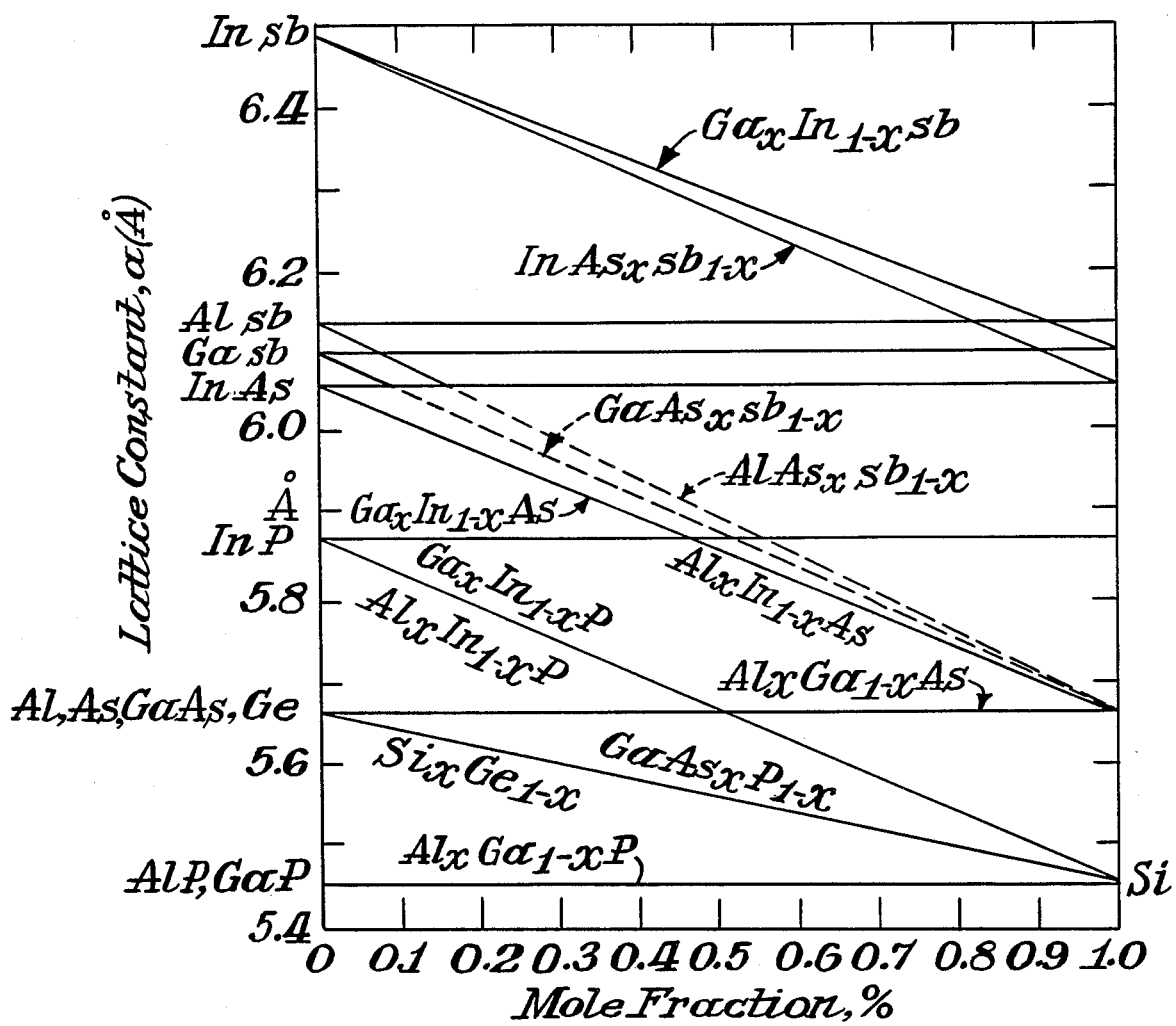

FIG. 1 (which corresponds to FIG. 5.4-1 of *Heterostructure Layers: Part B* by Casey et al. p. 25) plots the lattice constant against material composition and provides a basis for selecting the proper material system for the interface layer.

The second feature for reducing lattice mismatch effects minimizes the substrate/grown-layer contact, thus reducing detrimental defect and stress effects generated at the mismatched interface. The contact area is reduced with a selective growth mask which controls where growth initiates (where nucleation occurs) on the substrate. Typically, this mask is an oxide layer with selective openings which act as nucleation sites for the crystal growth. Other material, such as a nitride or carbide, can also be used for the selective growth mask. The selective growth mask also creates preferred crystal growth fronts, thereby reducing defects in the final crystal layer by causing lateral overgrowth of the mask. The reduced defect density in the overgrowth results from the tendency of defects to propagate vertically from the openings, not laterally into the overgrowth regions. A growth mask in accordance with the teachings of this invention reduces the substrate/grown-layer contact to much less than 50% and as little as 1% of the total surface area. By reducing the area of contact between the substrate and grown layers, the growth mask may also serve to reduce cracks that arise from thermal expansion mismatches. To further reduce defects in the final layer, a second growth mask non-aligned with the first can be used to terminate defects which propagate through the first mask.

Figure 2:
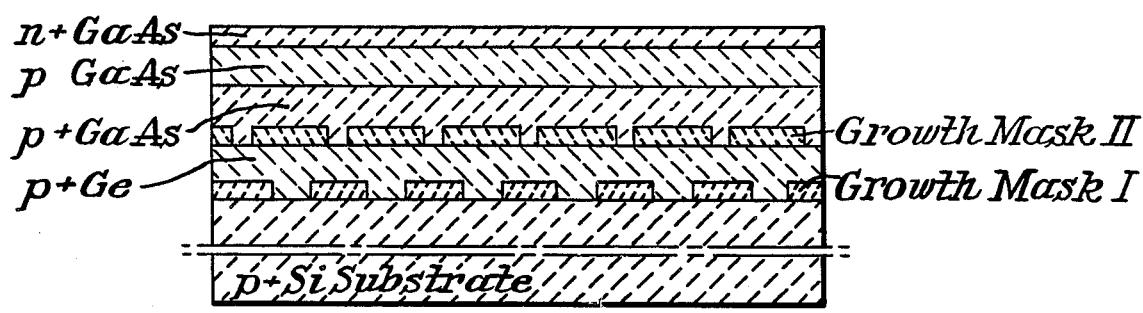

FIG. 2 exemplifies a structure for growing a GaAs n/p junction on Si with a Ge interface layer. FIG. 2 also illustrates a double growth mask structure which will produce the minimum number of defects in the final layer. The structure of FIG. 2 is thus an improved GaAs photovoltaic cell on a Si substrate. The thicknesses and doping levels of the GaAs layers of the solar cell show in FIG. 2, as well as electrical contacting means, antireflection layers, encapsulant and the like, which are not shown in the figure, are known in the art. For example, R. P. Gale, et al. in the *Proc. 15th IEEE Photovoltaic Specialists Conference* (1981) pp. 1051-1055, which is incorporated by reference herein, provides an exemplary description of a GaAs n/p solar cell that may be fabricated in accordance with this invention.

In this embodiment of the invention, the solar cell structure has two features to minimize defects in the GaAs layer: (1) a lattice matching and strain reducing germanium (Ge) interface layer and (2) defect limiting selective growth masks. In FIG. 2 the interface layer should grade the lattice parameter from that of Si to near GaAs. Germanium (Ge) will perform this function since Ge is lattice matched to GaAs and forms a continuous solid solution with Si. SG lends itself to growing a graded $Si_{1-x}Ge_x$ ($0 \leq X \leq 1$) interface layer since both materials can be simultaneously precipitated from the solution and incorporated in the grown layer. Selection of the proper solvent and growth temperature allows the growth of any $Si_{1-x}Gw_x$ alloy composition. Further, solution growth allows the final Ge layer to be highly doped to reduce series resistance.

The feature of defect limiting selective growth masks is incorporated at material growth interfaces. The masks are placed at both the Si/Ge and the Ge/GaAs interfaces as shown in FIG. 2. A Ge layer, as shown in FIG. 2, fills the openings in the first growth mask and forms a continuous layer over which the GaAs is formed. The Ge may also be a cap which is confined mostly to the openings in the growth mask. Tsaur et al.,(B-Y Tsaur, R. W. McClelland, John C. C. Fan, R. P. Gale, J. P. Salerno, B. A. Vojak, and C. O. Bozler, *Appl. Phy. Lett.*, 41(4),347 (1982)), have demonstrated, with CVD, that defects will not propagated laterally from openings in the growth mask (vias), but only propagate vertically. Hence, the laterally overgrown GaAs will have a reduced defect density. This invention describes the first use of lateral overgrowth with solution growth to reduce defect propagation in the grown layer. The second mask should be nonaligned with the first mask to terminate those defects which propagated vertically through the first mask. This should result in GaAs layers with defect densities comparable to GaAs layers grown on Ge or GaAs substrates. Prior to this invention, defect densities for GaAs layers on Si have not been comparable to those for GaAs layers on GaAs.

Both of these features have been incorporated in the GaAs solar cell of FIG. 2 on a Si substrate.

This invention overcomes the second problem, unfavorable solubility biases, with two features: (1) double saturation of the solvent and (2) selective supersaturation of the solvent. The first feature prevents dissolution of the substrate or a previously grown layer (material A) by saturating the solvent with material A prior to growth of the heteroepitaxial layer of material B. Prior to this invention, a system where the substrate is soluble in the solvent would result in dissolution of the substrate at the expense of growth of the heteroepitaxial layer. This limited the application of the solution growth technique to homoepitaxial structures, heteroepitaxial structures of material systems with similar solubilities (e.g. GaAs and AlGaAs), or material systems where the substrate has minimal solubility in the solvent (i.e. a "good" solubility bias, e.g. Ge on Si from tin).

The second solubility feature, selective supersaturation, is used in combination with the double saturation feature previously described and insures the desired material (material B, e.g., GaAs) grows on a substrate of a distinct material (material A, e.g., Ge) from a solution containing both materials. This second feature involves selective supersaturation of the solvent with the material to be grown (material B) before the substrate of material A is contacted by the solvent. Supersaturation refers to a solution having a concentration of solute atoms, in this case material B atoms, which exceeds the equilibrium concentration of solute atoms in the solvent at the given temperature. The supersaturation establishes a thermodynamic driving force for the supersaturated material to nucleate and grow on a substrate when the solution is put in contact with the substrate. The supersaturation must be less than that which causes spontaneous homogeneous nucleation of material B in the solution as this may prohibit subsequent growth on the substrate. In this case, where the solution is also saturated with the substrate material (material A), the solution should contact the substrate at the temperature at which the solution is in thermodynamic equilibrium with the substrate material. Contacting the substrate with the solution at this equilibrium temperature avoids the substrate being dissolved by a solution depleted of substrate material A. Also, contacting at this temperature removes any driving force for the substrate material (material A) to precipitate from the solution and grow on the substrate. This process enables the selective growth of one solute material from a solution which contains more than one solute species.

A significant feature of the present invention is the use of solution grown Ge to prepare the Si surface for solution growth of GaAs. At this time the exact role the Ge is playing is not known. Others have used a Ge layer between GaAs and Si to take up the lattice mismatch. Although the Ge in the present invention may also be reducing the lattice mismatch stress between GaAs and Si, at least two other explanations are possible. First, the Ge growth process may serve to prepare a 'clean' Si surface by removing any dirt or oxide from the Si surface. Due to solubility considerations, it is difficult to 'clean' the Si surface with the GaAs/Pb growth solution, thus making the 'precleaning' with the Ge growth necessary. Second, the solution grown Ge layer may realign the Si surface structure so that subsequent GaAs growth can occur. This realignment could relate to the Si surface bonds or to the surface step or terrace size.

Solution growth overcomes many of the limitations of the MBE and MOCVD growth techniques. Two important advantages result from solution growth. First, solution growth lends itself to selective area growth because the nucleation phase of growth can be limited to isolated areas with a selective area growth mask. The selective nature of solution growth is contrasted to MBE and MOCVD where, in general, growth occurs both on the selective area growth mask material and in the openings in the mask. This advantage is important when isolated GaAs devices are to be monolithically incorporated on a Si integrated circuit. Second, in general, solution growth, similar to liquid phase epitaxy, produces high quality material. The high material quality can be attributed to long minority carrier diffusion lengths, fewer deep traps, and the tendency of impurities to segregate to the growth solution.

Further examples detailing solution growth of GaAs on Si using solution grown Ge caps are found in the doctoral dissertation of co-applicant Zolper entitled "The Solution Growth of Gallium Arsenide on Silicon and Its Application to Gallium Arsenide Solar Cells" submitted to the University of Delaware in December 1987, the details of which are incorporated herein by reference thereto. The following examples are reported in chapter 4, Sections 4.3 and 4.5 of that dissertation.

In the growth of Ge on Si, the first step is preparation of the substrate. Prior to loading the Si substrate in the graphite boat for the solution growth process three steps of substrate preparation must be completed. These steps are: (1) initial scribing, cleaning and oxidation, (2) photoresist definition of growth pattern, and (3) oxide pattern etching and final Si clean. Starting with a standard Si wafer of the desired doping and orientation, the wafer is scribed with a diamond tipped scribe to the size of the slot in the solution growth boat slider. In this example, this is 0.6 inches by 1.0 inches. The scribing should be done with one side of the substrate made parallel to the flat orientation mark on the round wafer. This maintains a reference edge for future determination of the orientation of the seed wafer. The substrate should then be carefully cleaned. Immediately after cleaning, the substrate is loaded in an oxidation furnace where a wet or dry silicon dioxide layer of 1000 to 2000 Å is grown. Both types of oxides were used without any noted difference. The absolute thickness is not critical since it is only to be used as the media for the selective growth mask. The only criteria for the oxide thickness are that it is easily processed and that it remains intact during the growth process.

For step two, standard photolithographic techniques were used to define the selective growth mask. Samples can be stored after this stage in a clean Petri disk away from surface contaminates.

Next is the oxide pattern etching and final clean. This last clean should be done immediately prior to loading the substrate into the solution growth boat to reduce potential surface contamination during storage.

The Ge source wafer, used to insure the growth solution is saturated with Ge, is also cleaned prior to the Ge growth experiment.

The growth process of Ge on Si then takes place. The Ge layer is being grown on Si to function as an interface layer between the Si and the successive GaAs layer. The Ge serves to grade the lattice parameter from Si to near GaAs. It will also take-up the thermal expansion mismatch stress between Si and GaAs, clean the Si surface, and may realign the Si surface structure for GaAs growth. A selective growth mask is used to limit vertical defect propagation in the Ge layer and also to limit the thermal stress.

The key parameters in growing Ge on Si with a selective growth mask are: (1) solvent, (2) selective mask pattern and orientation, and (3) initial growth temperature and cooling rate. First, a solvent must be selected with a modest solubility of Ge to insure reasonable growth rates and a negligible solubility of Si to prevent substrate etchback. The solvent must also wet Si. Generally, since the surface free energies can not be exactly known, the degree of wetting was determined experimentally. Indium (In) with an oxide gettering agent of approximately 0.05 weight percent of total solvent Al or Mg was found to wet Si down to 500 ° C. Similarly, bismuth (Bi) with the addition of Mg was able to wet Si down to 600° C. Therefore, In and Bi were selected as the primary solvents for Ge growth on Si.

The Al and Mg additions help wetting by reducing any $SiO_2$ on the Si surface. This is necessary because even a 20 Å thick $SiO_2$ layer on the surface can prohibit wetting by the solvent. Al and Mg will reduce $SiO_2$ because they have a higher affinity for oxygen than $SiO_2$, demonstrated by their oxides ($Al_2O_3$ and MgO) having a more negative Gibbs free energy of formation.

Second, the selective growth mask must optimize lateral overgrowth while minimizing substrate/grown layer contact area. The minimized contact area will reduce vertical defect propagation and thermally generated stress in the Ge layer. A pattern that generates parallel lateral growth faces which coalesce uniformly would facilitate complete fill-in growth. Therefore, a selective growth mask of parallel lines was used for further Ge growth on Si. The lines were oriented parallel to one side of a natural cleavage plane.

The third parameter, initial growth temperature and cooling rate, must be optimized to achieve complete fill-in growth and thus uniform, continuous, overgrown Ge layers. The initial temperature should be kept low to reduce thermal stress in the growth layer and limit vertical growth rates by maintaining a modest Ge saturation level in the solvent. Vertical growth rates, and thus cooling rates, should be kept slow to allow lateral overgrowth to proceed at a maximum rate. Excessive cooling rates can deplete the solvent between lateral growth fronts and reduce lateral overgrowth. To further reduce vertical growth rates, the solution can be diluted with respect to the solute by adding a buffer material to the solvent. Any material which has low solubility of the material being deposited can be used as a solvent buffer. This approach affords a continuous range of solute concentration at a particular initial growth temperature. (When a buffer material is being selected the appropriate phase diagram should be consulted to insure no adverse affects will result such as the formation of undesirable compounds.) For Ge growths near 600° C., Bi was added to In solvent. At 600° C. Bi has a reduced solubility of Ge, relative to In, and thus reduces the overall amount of Ge in 10 grams of total solvent. The use of the buffer solvent also insures sufficient solution volume to adequately cover the substrate for a given well size. Bi, because of its low surface tension, may also help in the wetting of the Si.

One further addition to the solution was found to help wetting and lateral overgrowth. Additions of 1 to 2 weight percent of total solvent Ga resulted in better wetting through the selective growth masks and improved lateral overgrowth. The Ga could be acting as a wetting agent either by reducing the interface surface free energy between the seed and the solution or by assisting in reducing any $SiO_2$ on the surface. The improved lateral overgrowth may be explained by improved wetting of the oxide mask or the slight increase in Ge solubility caused by the Ga addition.

GE ON SI GROWTH PARAMETERS

Primary Solvents: In (4N) and Bi(5N+), 50/50 by weight

Additions to Solvent: 0.01-0.05 weight % of total solvent Al or Mg for wetting; 1-2 weight % of total solvent Ga for lateral overgrowth Initial Growth Temperature: 600° to 650° C.

Initial Overshoot: 20° C.

Cooling Rate: 0.05° C./min (typical)

Supercooling: 0.0° C.

Growth Excursion: 10°-15° C.

Realized Vertical Growth Rate: 0.16 microns/min (typical)

Vertical to Lateral Growth Rate: 1.5 to 1.2

Substrate Orientation: Exact (111) (best overgrowth)

Note: Standard industry procedure is to cut all highly doped (111) Si wafers 2 to 4 degrees off the exact crystal plane. These can be used as substrates but some reduction in lateral overgrowth occurs. Unless otherwise noted, all references to (111) seed orientation are cut exactly on this plane.

Next is the doping of the Ge interlayer. The Ge interlayer should be highly doped to form a good ohmic contact with the Si substrate and the successive GaAs layer. This layer should also be p-type, since the GaAs layer will tend to be doned p-type when Ge is in its growth solution or from Ge autodiffusion. For solution growth, the doping level and type are determined by examining the distribution coefficient and solid solubility concentrations of the materials used in the Ge growth solution - In, Bi, Ga, and Mg.

Checking the impurity type of these solution components (Sze 1968) shows In and Ga as acceptor impurities, both with levels 0.011 eV above the valence band. Impurity levels are not reported for Bi or Mg, but in general, Bi should be a donor impurity because it is in column V and Mg, which is in column IIA, will most likely be an acceptor. Bi and Mg are not well studied impurities in Ge, but if it can be shown that their concentration in the solid is below that of In and Ga, then the Ge layer will be p-type and only dependent on the In and Ga levels in the solution.

The following example relates to growth of GaAs on Si and fabrication of a light emitting diode in accordance with the teachings of this invention.

The procedures for cleaning and oxidizing the Si seed wafer for GaAs deposition are identical to those used for Ge growth previously described. However, the orientation of the seed wafer and the selective growth mask employed for GaAs growth differ from that used for Ge growth.

The wetting and nucleation phases of growth were separately controlled to realize selective area, device quality GaAs on Si. The development starts with solvent selection, proceeds to wetting of the Si, and concludes with controlled nucleation and fill-in crystal growth.

As with Ge growth on Si, the first parameter that must be set for a solution process is the carrier solvent. For the GaAs solubility, three solvents - Sn, Bi, and Pb meet these criteria Additionally, the solvent should not introduce excessive impurity levels into the grown GaAs. This is necessary to allow rectifying junctions to be fabricated in the deposited GaAs.

Since Bi is generally an isoelectronic impurity in IIIV semiconductors, it does not influence the doping level of the GaAs layers. With Bi as the carrier solvent the doping can be set, as in standard solution growth, by the addition of n-type (Te, Sn) or p-type (Ge) impurities in to the solution. If Sn is used as the solvent, donor impurity concentrations of $5 \times 10^{18}$ cm$^{-3}$ result, while for Pb solvent the donor concentration is reported as $2.8 \times 10^{18}$ cm$^{-3}$ Knowing that a p-type Zn diffusion process was available that achieved p-levels in excess of $3 \times 10^{18}$ cm$^{-3}$, both Bi and Pb were investigated as carrier solvents. For GaAs growth from these solvents, n+ type wafers were used to match the doping type in the GaAs being deposited.

The first step of the process was to develop a wetting procedure for Bi or Pb on Si. To prepare the Si surface to be wet in the GaAs growth solution a Ge capping layer was used. The Ge cap layer was grown as previously described. Typical growth parameters were: initial growth temperature of 600° C., ramp of 0.1° C./min, and excursion of 2° to 3° C. This layer served to remove any oxide from the Si surface and protect it until it was dissolved in the Bi or Pb solution to expose the "prepared" surface.

Nucleation of GaAs on Si was produced by supercooling the solution. Parallel experiments were run for both Bi and Pb with up to 15° C. supercooling at temperatures from 500° to 800° C. Limited growth occurred for Bi solvent, while successful nucleation was obtained with Pb solvent.

GaAs was grown on selective areas of n+ (100) Si from 99.999% pure Pb using a conventional LPE slider bar system. A 15 gram Pb solution was saturated with GaAs at 650° C. Cooling rates of 0.5° to 2.0° C./minute were employed with 5° to 10° C. supercooling of the solution prior to contacting with the Si seed. Vertical growth rates of 0.5 to 2.0 μm/minute were observed depending on the fraction of Si seed area exposed by the selective growth mask. Prior to the GaAs growth, the Si surface was prepared by growing Ge caps in the mask vias from alloy solutions of indium and bismuth at 600° C.

A selective area SiO$_2$ growth mask controlled where GaAs was deposited on the Si substrate. Attachment only occurred where the SiO$_2$ had been removed. No growth occurred on the SiO$_2$. The SiO$_2$ was thermally grown in dry oxygen at 1000° to 1100° C. Oxide thicknesses of 1500 to 2500 Å typical For the mask pattern, an array of holes or circular vias was photolithographically defined and etched in the SiO$_2$ with buffered HF.

With Pb as the solvent, the grown crystals contain n-type Pb impurities to Pb's solid solubility limit in GaAs at 650° C. Kressel, et al., in *J. Appl. Phys.*, 39, 5647 (1968) reported the level of ionized n-type Pb impurities in GaAs from a Pb rich growth solution to be $2.9 \times 10^{18}$ cm$^{-3}$ at 1025° C. This was taken as the upper limit for the n-type doping level. A Zn liquid source (Zn:Ga:As) diffusion process that achieved p-type levels greater than $3 \times 10^{18}$ cm$^{-3}$ was used to fabricate the LED junctions. The Si substrate was n+ (0.002 to 0.05Ω-cm).

Contact to the GaAs was realized by evaporating 60 to 100 Å of Au:Zn (2 atomic % Zn) across the complete top surface of the sample. After annealing for 1 minute at 470° C., the GaAs crystals could be directly contacted with a standard probe setup. The Au:Zn was sufficiently transparent to allow light emission. The Si was contacted at the back with a standard Al evaporation process.

Over 100 GaAs LEDs with top surfaces of 60 by 60 μm$^2$ were fabricated on a two cm$^2$ sample. Thicknesses varied from 20 to 70 μm depending on growth conditions and the via pattern. Light emission was typically first observed at forward bias levels of 0.7 to 0.8 volts and 6 to 8 mA. These values are typical for a GaAs LED. A strong signal was evident at 0.9 to 1.0 volts and 10 mA forward bias. Forward currents of 40 mA were safely applied. I-V curves showed evidence of both shunt and series resistance. FIG. 3 is a process flow chart summarizing the steps for the growth of GaAs on Si using a single growth mask and Ge cap and noting where individual steps have been previously described in the literature, the details of which are incorporated herein, by reference thereto.

1. Clean n+(100) Si using organic solvents, H$_2$SO$_4$:- H$_2$O$_2$, HF, and ultrapure di-H$_2$O (Ghandi, Sorab K., *VLSI Fabrication Principles: Silicon and Gallium Arsenide*, (New York: John Wiley & Sons) chap. 9 (1983))

2. Oxidize Si in dry oxygen at 1000° to 1100° C. to grow 1000 to 3000 Å SiO$_2$ (Hamilton, Douglas J., and William G. Howard, *Basic Integrated Circuit Engineering*, (New York: McGraw Hill) p. 63 (1975)).

3. Photolithographically define growth mask pattern (McGillis, D. A., chapter 7 in *VLSI Technology*, edited by S. M. Sze, (New York: McGraw Hill) (1983)).

4. Etch growth mask pattern into SiO$_2$ using buffered HF for 10 to 30 seconds.

5. Grow Ge cap:
   Primary solvents: In and Bi, 50/50 by weight
   Additions to solvent: 0.01 to 0.05 weight % total solvent Al or Mg reducing agent (U.S. Pat. No. 4,677,250); 1-2 weight % of total solvent Ga
   Initial temperature: 600° to 650° C.
   Cooling rate: 0.05° to 0.2° C./minute
   Growth excursion: 1° to 5° C.
   Substrate orientation: exact (100)

6. Clean Ge caps using organic solvents, H$_2$SO$_4$:- H$_2$O$_2$, HCl:H$_2$O$_2$, HF, and ultrapure di-H2O. (Ghandi, Sorab K., *VLSI Fabrication Principles: Silicon and Gallium Arsenide*, (New York: John Wiley & Sons) chap. 9 (1983))

7. Grow GaAs on Si through growth mask:

Primary solvent: Pb
Initial temperature: 650° C.
Cooling rate: 0.5° to 2.0° C./min
Supercooling: 4° to 12° C.
Growth excursion: 40° to 60° C.
Realized vertical growth rate: 0.5 to 2.5 $\mu$/min; depending on the growth mask pattern
Vertical to Lateral Growth Rate: 1:1 to 1:2
Substrate Orientation: Exact (100) (best growth)

8. Complete GaAs overgrowth to form a continuous GaAs layer. (Some applications may not require complete overgrowth. In such a case the process may be terminated after step 7.) It should be understood that the teachings of this invention are applicable in its scope to techniques for any heteroepitaxial growth process. While the invention has been described with particular reference to photovoltaic solar cells, the invention may be used, for example, for growing GaAs on silicon for various electronic and optoelectronic applications. The invention may have the following uses:

1. The growth of GaAs on Si for:
  a. low-cost, high-performance GaAs solar cells;
  b. monolithic optical emitters and detectors on Si integrated circuits;
  c. large-area, low-cost GaAs wafers.
2. The growth of GaAlAs or GaAsP on Si for:
  a. low-cost, high-performance tandem solar cells;
  b. monolithic integration of lasers on Si integrated circuits;
  c. monolithic integration of waveguides on Si integrated circuits.
3. The growth of GaAs on thinned Ge for high power-to-weight space solar cells. 4. The growth of InP on Si for low-cost, high performance solar cells. 5. The growth of GaP on GaAs for surface passivation for GaAs solar cells.

What is claimed is:

1. In a method of making semiconductor structures by solution growth of heterostructure layers wherein a heterostructure capping layer is solution grown on a substrate and is subsequently at least partially removed by dissolution during solution growth of a second, different heterostructure layer, the improvement comprising preparation of the substrate surface by the solution grown heterostructure capping layer to facilitate solution growth of the second heterostructure layer.

2. In a method of claim 1 wherein the substrate is Si, the capping layer is Ge or a Ge/Si alloy, and the second heterostructure layer is GaAs.

3. In a method of claim 2 wherein the GaAs heterostructure layer is made into a solar cell.

4. In a method of claim 1 wherein the surface preparation involves oxide removal from the substrate.

5. In a method of claim 1 wherein the surface preparation involves restructuring of the substrate surface.

6. In a method of claim 1 wherein the removal by dissolution of the heterostructure capping layer is incomplete so that an interface layer remains between the substrate and second heterostructure layer.

7. In a method of claim 6 wherein the substrate is Si, the capping layer is Ge or a Ge/Si alloy, and the second heterostructure layer is GaAs.

8. In a method of claim 7 wherein the GaAs heterostructure layer is made into a solar cell.

9. In a method of claim 6 wherein the heterostructure capping layer is grown on selected ares of the substrate, the growth area being defined by a selective growth mask, and the second heterostructure layer is grown on the same selected areas of the substrate.

10. In a method of claim 9 wherein the substrate is Si, the capping layer is Ge or a Ge/Si alloy, the second heterostructure layer is GaAs, and the growth mask is silicon dioxide.

11. In a method of claim 10 wherein the heterostructure GaAs layer is made into a light-emitting diode.

12. In a method of claim 1 wherein the heterostructure capping layer is grown on selected areas of the substrate, the growth area being defined by a selective growth mask, and the second heterostructure layer is grown on the same selected areas of the substrate.

13. In a method of claim 12 wherein the substrate is Si, the capping layer is Ge or a Ge/Si alloy, the second heterostructure layer is GaAs, and the growth mask is silicon dioxide.

14. In a method of claim 13 wherein the heterostructure GaAs layer is made into a light-emitting diode.

* * * * *